United States Patent [19]

Antes et al.

[11] 3,998,980
[45] Dec. 21, 1976

[54] FABRICATION OF THICK FILM RESISTORS

[75] Inventors: Alan C. Antes, Colorado Springs; James R. Drehle, Fort Collins; Blair H. Harrison, Colorado Springs, all of Colo.

[73] Assignee: Hewlett-Packard Company, Palo Alto, Calif.

[22] Filed: May 30, 1974

[21] Appl. No.: 474,827

Related U.S. Application Data

[63] Continuation of Ser. No. 250,771, May 5, 1972, abandoned.

[52] U.S. Cl. .............................. 427/103; 427/101; 427/376 A; 427/376 C; 427/379; 427/380; 29/620

[51] Int. Cl.² .................... H01C 17/06; B05D 5/12

[58] Field of Search ........................ 427/101–103, 427/376 A, 376 C, 379, 380; 29/620

[56] References Cited

UNITED STATES PATENTS

| | | | |
|---|---|---|---|
| 3,200,010 | 8/1965 | Place | 428/450 |
| 3,308,528 | 3/1967 | Ballard | 427/103 |
| 3,370,262 | 2/1968 | Marty | 29/620 |
| 3,386,165 | 6/1968 | Bruhl | 427/102 |
| 3,453,727 | 7/1969 | Touw | 29/620 |
| 3,457,637 | 7/1969 | Halpern | 29/620 |
| 3,560,410 | 2/1971 | Schubert | 427/101 |
| 3,607,386 | 9/1971 | Galla | 427/103 |
| 3,699,650 | 10/1972 | Cocca | 427/103 |

*Primary Examiner*—Michael F. Esposito
*Attorney, Agent, or Firm*—Roland I. Griffin; William E. Hein

[57] ABSTRACT

A glass material is deposited upon a ceramic substrate and then fired at an elevated temperature in air. Screen printed resistor elements formed on the glass material are fired, lapped, and annealed.

9 Claims, 1 Drawing Figure

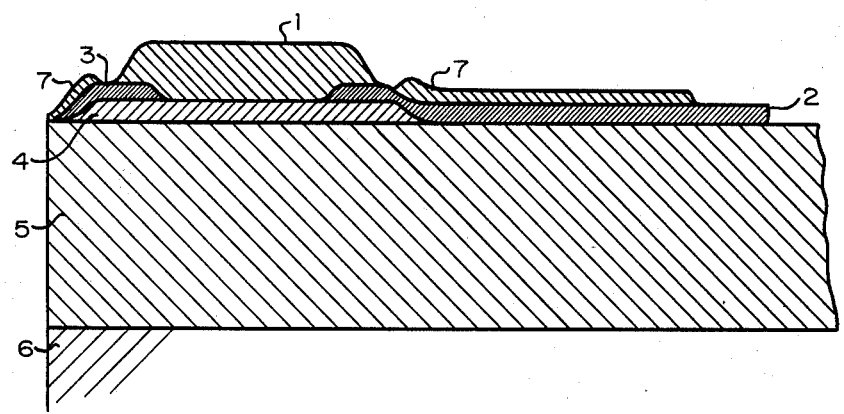

FABRICATION OF THICK FILM RESISTORS

This is a continuation of application Ser. No. 250,771, filed May 5, 1972, now abandoned.

BACKGROUND AND SUMMARY OF THE INVENTION

This invention relates generally to the fabrication of resistive elements and more particularly to a thick film process therefor. Such a process might be employed, for example, in constructing a thermal print head containing a plurality of resistive elements which act to produce marks upon an adjacent thermally-sensitive record material upon energization by a short duration pulse of electric current. A print head so constructed might be employed as shown and described in a copending U.S. Patent Application Ser. No. 250,703, now abandoned entitled THERMAL PRINTER, filed by Robert E. McMillan, Jr. May 5, 1972, and assigned to the same assignee as this application. Resistive elements constructed according to the prior art have typically been applied to a semiconductor substrate by conventional thin film processes. The result is a thin element which is susceptible to abrasion by the thermal record material passing the print head. This abrasion over a period of time effects changes in the basic characteristics of the resistors which result in deteriorated printing quality. In addition, the resistive elements have typically been applied to an edge surface of the substrate, while their respective conductors have been applied to the face surfaces of the substrate. This arrangement is not feasible in applications requiring a large number of resistive elements because of the small area available on the substrate edge for making interconnections between the elements and their conductors. Also, considerable difficulty has been encountered in controlling the surface of resistors which are applied to the edge of a substrate. For these reasons it would be advantageous to position both the resistive elements and their conductors on one face of the substrate. Another problem exists because the elements have been attached directly to the substrate. Upon energization, a considerable portion of the applied power escapes into the substrate, thus producing less heat in the element itself. Because of this inefficiency greater amounts of power are required to perform the printing operation.

In fabricating resistors as part of multilayer thick film circuits, it has previously been possible to screen print them only directly on the substrate without adversely affecting the resistance, temperature coefficient of resistance, long term stability, and power handling capability of the resistive material. These prior art techniques allowed only those resistance and temperature coefficient of resistance values yielded by the basic material so that special requirements could not be met. It is desirable to be able to screen print resistors over a glass layer to enable placement thereof at any layer of a multilayer circuit. It is also desirable to be able to tailor the various resistors and their respective temperature coefficients of resistance without affecting resistor power handling capability.

Accordingly, it is an object of this invention to provide an improved process of fabricating thick film resistive elements such as might be used, for example, in thermal print heads.

It is another object of this invention to provide an improved process for fabricating thick film resistive elements on top of a layer of glass material.

It is a further object of this invention to provide an improved process for fabricating thick film resistive elements having resistance and temperature coefficient of resistance values that may be tailored to particular requirements.

These objects are accomplished in accordance with the preferred embodiment of this invention by depositing a layer of glass material upon a ceramic substrate using screen printing techniques well known in the art. The glass material is then fired in air at an elevated temperature. A resistor-conductor network is then placed thereon, again using conventional screen printing processes. The resistors are next fired, lapped, and annealed.

DESCRIPTION OF THE DRAWING

The drawing is a cross sectional view showing the various material layers required in constructing a resistor according to the preferred embodiment of this invention.

DESCRIPTION OF THE PREFERRED EMBODIMENT

Referring to the drawing, there is shown a substrate 5 having a pair of edge surfaces and a pair of face surfaces, upon one of the face surfaces of which a pattern of one or more resistive elements is to be formed. This substrate may comprise any one of a number of ceramic materials, such as alumina. A glass layer 4 which may comprise a crystallizable dielectric material composed primarily of glass and aluminum oxide is next screen printed on one face surface of the substrate in a pattern corresponding to the desired resistor pattern. Such a dielectric material is manufactured and marketed as Dupont 8299. This glass layer serves as a thermal barrier when the resistor is employed as a thermal print element. By providing such a layer having low thermal conductivity the resistor temperature rises rapidly toward the print threshold level when a short duration pulse of current is applied. Any heat which penetrates glass layer 4 is dissipated in substrate 5. Dissipation capacity may be increased by adding a heat sink 6. Glass layer 4 also serves to elevate the resistor for better contact with the thermal record material during printing, thus eliminating any air barrier which would reduce the head transfer efficiency. Such elevation also facilitates contact with the resistor when employed in constructing a potentiometer and in some heating applications. The glass layer is allowed to dry and is then fired in air at a temperature ranging from 850° to 1100° C., depending upon the type of material and firing time. Proper firing time has been found to range from 10 minutes to greater than 5 hours, depending upon the type of material used and the firing temperature. For the case of Dupont 8299 optimum firing conditions are 940° C. for 5½ hours. The rate of decrease or increase in temperature during firing is not critical so long as commonly recognized thick film firing practices are followed.

Current for the resistive element is supplied through a conductor element 2 which is screen printed over glass layer 4 and ceramic substrate 5. Connection to ground is made through a conductor element 3 which is screen printed simultaneously with conductor element 2. Conductor element 3 may be made to serve several resistors in common in order to avoid a proliferation of electrical connections. The material for these conductors 2 and 3 is not critical and may be selected from any one of the alloy families of golds, palladium silvers, platinum gold, or palladium golds such as are typically used by the thick film circuit industry. These materials may be obtained from such companies as Alloys Unlimited, Dupont, or Electro Science Laboratories. The conductors are next fired in air at temperatures ranging from 850° to 1100° C. utilizing techniques well known to those skilled in the art.

A resistor element 1 is next applied using well known screen printing techniques and may comprise as many layers as required to achieve a desired resistor thickness. It has been determined that resistor thicknesses ranging from 0.0005 inch to 0.01 inch work well as heating elements for employment in thermal printers. The material used in constructing the resistor element may be a resistor ink containing bismuth ruthenium oxide. Such an ink is commercially available as Dupont "Birox" resistor ink. Other resistor inks such as are supplied by Alloys Unlimited or Electro Science Laboratories may also be chosen. When printed, the resistor element is fired in a neutral or oxidizing atmosphere at temperatures ranging from 850° to 1100° C. In order to maintain a flat resistor surface, the fired resistor may be lapped using techniques well known in the art. Lapping may occur after each layer is printed and fired or after firing the final resistor layer. In constructing a multilayer resistor, firing may take place after completion of each layer or after completion of the final layer. The lapping step may be used to tailor the temperature coefficient of resistance or the resistor value to exact requirements without changing the basic power handling characteristics of the resistive material.

After the resistor construction is complete it is annealed according to conventional thick film techniques. This step serves to recrystallize the resistor material to prevent subsequent formation of microcracks therein. Without the annealing step, microcracks may form over a period of time and result in increased resistance values. Finally, an abrasion-resistant layer 7 is provided to protect the relatively delicate conductors 2 and 3 from possible damage. A glass material which might comprise, for example, Dupont 8185 may be screen printed over the conductors to form layer 7.

We claim:

1. A process for fabricating a thick film resistor upon an element, said process comprising the steps of:
   depositing a crystallizable dielectric layer upon the element;
   firing the crystallizable dielectric layer at an elevated temperature;
   depositing a layer of cermet resistive material upon the crystallizable dielectric layer; and
   firing the cermet resistive material at an elevated temperature in a neutral atmosphere.

2. A process as in claim 1 wherein the cermet resistive material is fired at an elevated temperature in an oxidizing atmosphere.

3. A process as in claim 2 wherein the crystallizable dielectric layer is fired at a temperature within the range of 850° to 1100° C. and for a time period greater than ten minutes.

4. A process as in claim 1 wherein the crystallizable dielectric layer is fired at a temperature within the range of 850° to 1100° C. and for a time period greater than ten minutes.

5. A process as in claim 1 wherein the element is a ceramic substrate and the crystallizable dielectric layer is deposited upon a face surface thereof.

6. A process as in claim 1 further comprising the step of lapping the fired cermet resistive material.

7. A process as in claim 6 further comprising the step of annealing the cermet resistive material to impede the formation of microcracks therein.

8. A process as in claim 1 wherein said crystallizable dielectric layer is glass.

9. A process as in claim 2 wherein said crystallizable dielectric layer is glass.

* * * * *

UNITED STATES PATENT AND TRADEMARK OFFICE
CERTIFICATE OF CORRECTION

PATENT NO. : 3,998,980
DATED : December 21, 1976
INVENTOR(S) : Alan C. Antes; James R. Drehle; Blair H. Harrison It is certified that error appears in the above–identified patent and that said Letters Patent are hereby corrected as shown below:

Column 1, line 19, "McMillan, Jr. May 5, 1972" should read --McMillan, Jr. on May 5, 1972--; and Column 2, line 46, "the head transfer" should read --the heat transfer--.

Signed and Sealed this

First Day of March 1977

[SEAL]

Attest:

RUTH C. MASON
Attesting Officer

C. MARSHALL DANN
Commissioner of Patents and Trademarks